United States Patent
Kim

(10) Patent No.: US 10,553,261 B2
(45) Date of Patent: Feb. 4, 2020

(54) SEMICONDUCTOR MEMORY APPARATUS WITH MEMORY BANKS AND SEMICONDUCTOR SYSTEM INCLUDING THE SAME

(71) Applicant: SK hynix Inc., Icheon-si, Gyeonggi-do (KR)

(72) Inventor: Hyun Seung Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/989,609

(22) Filed: May 25, 2018

(65) Prior Publication Data

US 2019/0130949 A1 May 2, 2019

(30) Foreign Application Priority Data

Oct. 31, 2017 (KR) .................. 10-2017-0143325

(51) Int. Cl.
*G11C 7/10* (2006.01)
*G11C 7/22* (2006.01)
*G11C 8/12* (2006.01)
*G11C 8/06* (2006.01)

(52) U.S. Cl.
CPC ............ *G11C 7/109* (2013.01); *G11C 7/1069* (2013.01); *G11C 7/1093* (2013.01); *G11C 7/1096* (2013.01); *G11C 7/222* (2013.01); *G11C 8/06* (2013.01); *G11C 8/12* (2013.01)

(58) Field of Classification Search
CPC .................................. G11C 7/109; G11C 8/06
See application file for complete search history.

(56) References Cited

U.S. PATENT DOCUMENTS

| | | | |
|---|---|---|---|
| 7,742,349 B2 | 6/2010 | Jeong et al. | |
| 2001/0043507 A1* | 11/2001 | Ooishi | G11C 7/1072 365/233.1 |
| 2003/0081490 A1* | 5/2003 | Nagasawa | G11C 8/12 365/230.03 |
| 2008/0101135 A1* | 5/2008 | Koo | G11C 7/1069 365/189.11 |
| 2008/0112251 A1* | 5/2008 | Youn | G11C 5/025 365/230.03 |
| 2008/0239840 A1* | 10/2008 | Park | G11C 7/1048 365/189.17 |
| 2016/0224480 A1* | 8/2016 | Ku | G06F 13/1668 |
| 2017/0031747 A1* | 2/2017 | Kim | G06F 11/0784 |
| 2017/0192845 A1* | 7/2017 | Kim | G06F 11/1048 |
| 2018/0047435 A1* | 2/2018 | Jung | G11C 7/10 |
| 2018/0158494 A1* | 6/2018 | Park | G11C 7/1027 |
| 2019/0065090 A1* | 2/2019 | Kandikonda | G06F 3/0625 |
| 2019/0079672 A1* | 3/2019 | Kim | G06F 3/061 |

FOREIGN PATENT DOCUMENTS

KR 1020060090384 A 8/2006

* cited by examiner

*Primary Examiner* — Mushfique Siddique
(74) *Attorney, Agent, or Firm* — William Park & Associates Ltd.

(57) ABSTRACT

A semiconductor memory apparatus includes first and second byte pads. A left-side peri-line couples the first byte pad and a first memory bank region and a right-side peri-line couples the second byte pad and a second memory bank region. A peri-repeater couples the left-side peri-line and the right-side peri-line based on a peri-strobe signal. The peri-strobe signal is generated based on byte information and memory bank selection information.

24 Claims, 7 Drawing Sheets

FIG.6
330
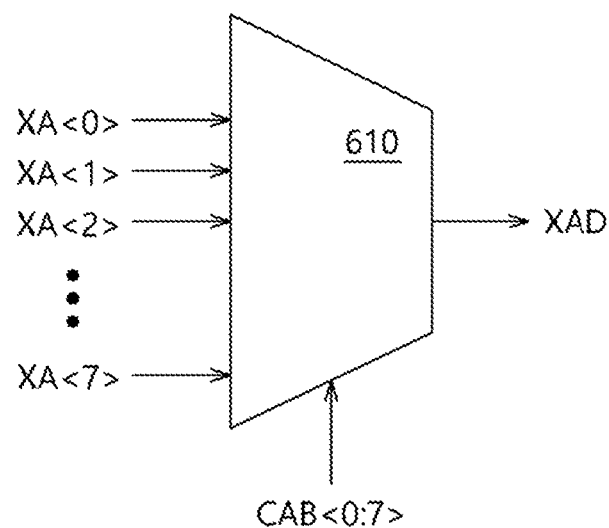
FIG.7
340
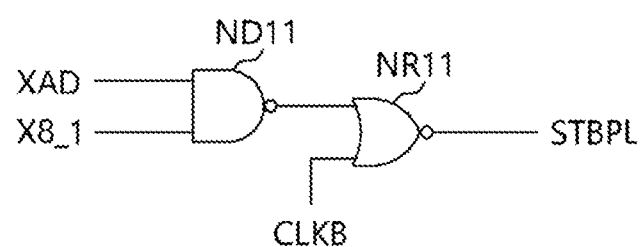
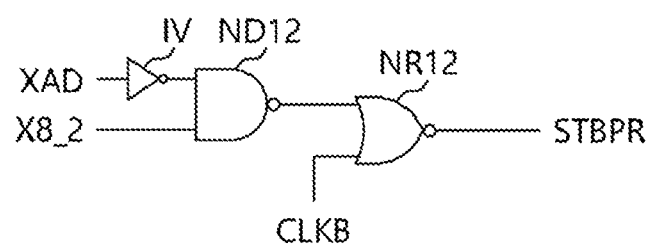

SEMICONDUCTOR MEMORY APPARATUS WITH MEMORY BANKS AND SEMICONDUCTOR SYSTEM INCLUDING THE SAME

CROSS-REFERENCES TO RELATED APPLICATION

The present application claims priority under 35 U.S.C. § 119(a) to Korean application number 10-2017-0143325, filed on Oct. 31, 2017, in the Korean Intellectual Property Office, which is incorporated herein by reference in its entirety as set forth in full.

BACKGROUND

1. Technical Field

Various exemplary embodiments of the present invention relate to a semiconductor technology and, more particularly, to a semiconductor memory apparatus and a semiconductor system.

2. Related Art

An electronic device includes many electronic elements, and a computer system includes many electronic elements comprising semiconductor apparatuses. A semiconductor memory apparatus among the semiconductor apparatus of the computer system may communicate with a host such as a processor, and may store and output data. The semiconductor memory apparatus may be classified into a volatile memory apparatus and a nonvolatile memory apparatus according to whether the semiconductor memory apparatus can retain data stored therein even when power supply is cut off. The volatile memory apparatus may include a static RAM (SRAM), a dynamic RAM (DRAM), and a synchronous DRAM (SDRAM). The nonvolatile memory apparatus may include a read only memory (ROM), a programmable ROM (PROM), an electrically erase and programmable ROM (EEPROM), an electrically programmable ROM (EPROM), a flash memory, a phase change RAM (PRAM), a magnetic RAM (MRAM), a resistive RAM (RRAM), and a ferroelectric RAM (FRAM).

The semiconductor memory apparatus may include a data storage region, which is referred to as a memory bank. Bit lines and word lines may be arranged in the memory bank. The memory bank may have memory cells arranged at cross-points between the bit lines and word lines. In general, the semiconductor memory apparatus may include a plurality of memory banks. A selected memory bank may selectively perform operations of storing data and outputting the data among the plurality of memory banks according to an operation mode. The semiconductor memory apparatus may have a data pad coupled to a data bus. The semiconductor memory apparatus may receive data provided from a host through the data pad. The semiconductor memory apparatus may output data to the host through the data pad. The semiconductor memory apparatus may have data line configured to transfer data between the data pad and the plurality of memory banks.

SUMMARY

In an embodiment, a semiconductor memory apparatus may include: a left-side peri-line configured to couple a first byte pad and a first memory bank region; a right-side peri-line configured to couple a second byte pad and a second memory bank region; a peri-repeater configured to couple the left-side peri-line and the right-side peri-line based on a peri-strobe signal; a first bank repeater configured to couple the left-side peri-line and a first bank line arranged in the first memory bank region based on a first bank strobe signal; a second bank repeater configured to couple the right-side peri-line and a second bank line arranged in the second memory bank region based on a second bank strobe signal; and a control circuit is configured to generate the peri-strobe signal, the first bank strobe signal, and the second bank strobe signal based on byte information and memory bank selection information.

In an embodiment, a semiconductor memory apparatus may include: a left-side peri-line configured to couple a first byte pad and a first memory bank region; a right-side peri-line configured to couple a second byte pad and a second memory bank region; a left-side peri-repeater configured to couple the left-side peri-line and a middle peri-line based on a first peri-strobe signal and a second peri-strobe signal; a right-side peri-repeater configured to couple the middle peri-line and the right-side peri-line based on the first peri-strobe signal and the second peri-strobe signal; and a control circuit configured to generate the first and second peri-strobe signals based on byte information and memory bank selection information, and to adjust a time of outputting the first and second peri-strobe signals based on write information.

BRIEF DESCRIPTION OF THE DRAWINGS

FIG. 6 is a diagram illustrating a representation of an example configuration of a synchronization output circuit shown in FIG. 3;

FIG. 7 is a diagram illustrating a representation of an example configuration of a peri-repeater control circuit shown in FIG. 3.

DETAILED DESCRIPTION

Hereinafter, a semiconductor apparatus according to the present disclosure will be described below with reference to the accompanying drawings through exemplary embodiments.

Figure 1:
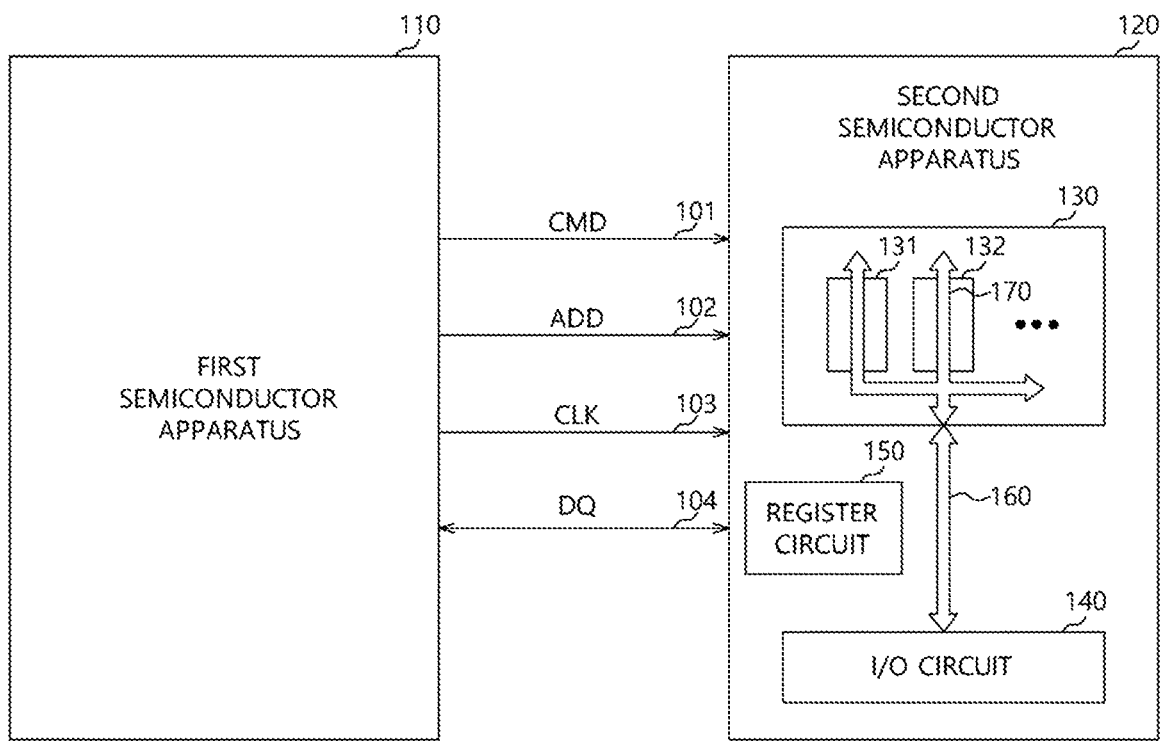
FIG. 1 is a diagram illustrating a representation of an example configuration of a semiconductor system in accordance with an embodiment.

FIG. 1 is a diagram illustrating a representation of an example configuration of a semiconductor system in accordance with an embodiment. Referring to FIG. 1, the semiconductor system 1 may include a first semiconductor apparatus 110 and a second semiconductor apparatus 120. The first semiconductor apparatus 110 and the semiconductor apparatus 120 may communicate with each other. In an embodiment, the first semiconductor apparatus 110 may be a master apparatus, and the second semiconductor apparatus 120 may be a slave apparatus controlled by the first semiconductor apparatus 110. For example, the first semiconductor apparatus 110 may be a host apparatus such as a processor or a controller. The first semiconductor apparatus 110 may include a central processing unit (CPU), a graphic processing unit (GPU), a multi-media processor (MMP), a digital signal processor and a memory controller. The first semiconductor apparatus 110 may be implemented as a system on chip by combining multi-functional processor chips such as an application processor (AP). The second semiconductor apparatus 120 may be a memory apparatus. The memory apparatus may include a volatile memory apparatus and a nonvolatile memory apparatus. The volatile memory apparatus may include a static RAM (SRAM), a dynamic RAM (DRAM), and a synchronous DRAM (SDRAM). The nonvolatile memory apparatus may include a read only memory (ROM), a programmable ROM (PROM), an electrically erasable and programmable rom (EEPROM), an electrically programmable ROM (EPROM), a flash memory, a phase change RAM (PRAM), a magnetic RAM (MRAM), a resistive RAM (RRAM) and a ferroelectric RAM (FRAM).

The first semiconductor apparatus 110 may provide various control signals to the second semiconductor apparatus 120 to control the second semiconductor apparatus 120 for a data communication. For example, the first semiconductor apparatus 110 may be electrically coupled to the second semiconductor apparatus 120 through a command bus 101, an address bus 102, a clock bus 103, and a data bus 104. The command bus 101 may be a one-way signal transmission line for transferring a command signal CMD. The address bus 102 may be a one-way signal transmission line for transferring an address signal ADD. The clock bus 103 may be a one-way signal transmission line for transferring a clock signal CLK. In an embodiment, the clock bus 103 may transfer a plurality of clock signals CLK including a system clock signal and a data clock signal. The data clock signal may be used for synchronizing data, and the system clock signal may be used for synchronizing control signal not including the data. The data bus 104 may be a two-way signal transmission line for transferring data DQ. During a data input operation or a write operation, data may be provided from the first semiconductor apparatus 110 to the second semiconductor apparatus 120 and the second semiconductor apparatus 120 may store the provided data. During a data output operation or a read operation, data stored in the second semiconductor apparatus 120 may be provided to the first semiconductor apparatus 110. For a write operation, the first semiconductor apparatus 110 may provide the second semiconductor apparatus 120 with the command signal CMD, the address signal ADD, and the data DQ to be written. For a read operation, the first semiconductor apparatus 110 may provide the second semiconductor apparatus 120 with the command signal CMD and the address signal ADD and the second semiconductor apparatus 120 may provide the first semiconductor apparatus 110 with the data DQ that is read.

Referring to FIG. 1, the second semiconductor apparatus 120 may include a memory bank region 130, an input/output circuit 140, and a register circuit 150. The memory bank region 130 may include a plurality of memory banks 131 and 132. In each of the plurality of memory banks 131 and 132, a plurality of bit lines and a plurality of word lines may be provided and memory cells may be coupled at cross-points of the respective bit lines and the respective word lines. The memory bank region 130 may be divided into a left-side memory bank region and a right-side memory bank region.

Each left-side memory bank region and right-side memory bank region may include an even bank region and an odd bank region. The input/output circuit 140 may be electrically coupled to the first semiconductor apparatus 110 through the data bus 104. The input/output circuit 140 may have data pads and driving circuits for receiving data DQ provided through the data bus 104 and for outputting data DQ through the data bus 104. The input/output circuit 140 may be electrically coupled to the memory bank region 130 through a peri-line 160. The peri-line 160 may be a transmission line for transferring data between the memory bank region 130 and the input/output circuit 140. In the memory bank region 130, a bank line 170 may be provided. The bank line 170 may be electrically coupled to the peri-line 160. The bank line 170 may provide the plurality of memory banks 131 and 132 with data provided through the peri-line 160. The bank line 170 may provide the peri-line 160 with data output from the plurality of memory banks 131 and 132. Although not illustrated, the second semiconductor apparatus 120 may further include a peri-repeater for driving the peri-line 160 and a bank repeater for driving the bank line 170. The peri-repeater and the bank repeater will be described later.

The register circuit 150 may store operation information about the second semiconductor apparatus 120. The register circuit 150 may receive the command signal CMD from the first semiconductor apparatus 110 through the command bus 101. The register circuit 150 may store various operation information about the second semiconductor apparatus 120 based on the command signal CMD. The various operation information may include byte information. In accordance with an embodiment, the second semiconductor apparatus 120 may operate in various operation modes. For example, the second semiconductor apparatus 120 may operate in a first byte operation mode and a second byte operation mode. The first byte operation mode may be an X8 operation mode where it is possible to input and output 8 successive bits of data. The second byte operation mode may be an X16 operation mode where it possible to input and output 16 successive bits of data. The input/output circuit 140 of the second semiconductor apparatus 120 may include 16 data pads for receiving 16-bit data. In the first byte operation mode, the 16 data pads may be divided into two groups of 8 data pads. The two groups of data pads may selectively receive data through the data bus 104 and output data through the data bus 104. The byte information may include information about whether the second semiconductor apparatus 120 operates in the first byte operation mode, information about whether the second semiconductor apparatus 120 operates in the second byte operation mode, and information concerning an active group among the two groups of data pads in the first byte operation mode. For example, the operation mode of the second semiconductor apparatus 120 may be set according to the command signal CMD and the byte information may be stored in the register circuit 150.

Figure 2:
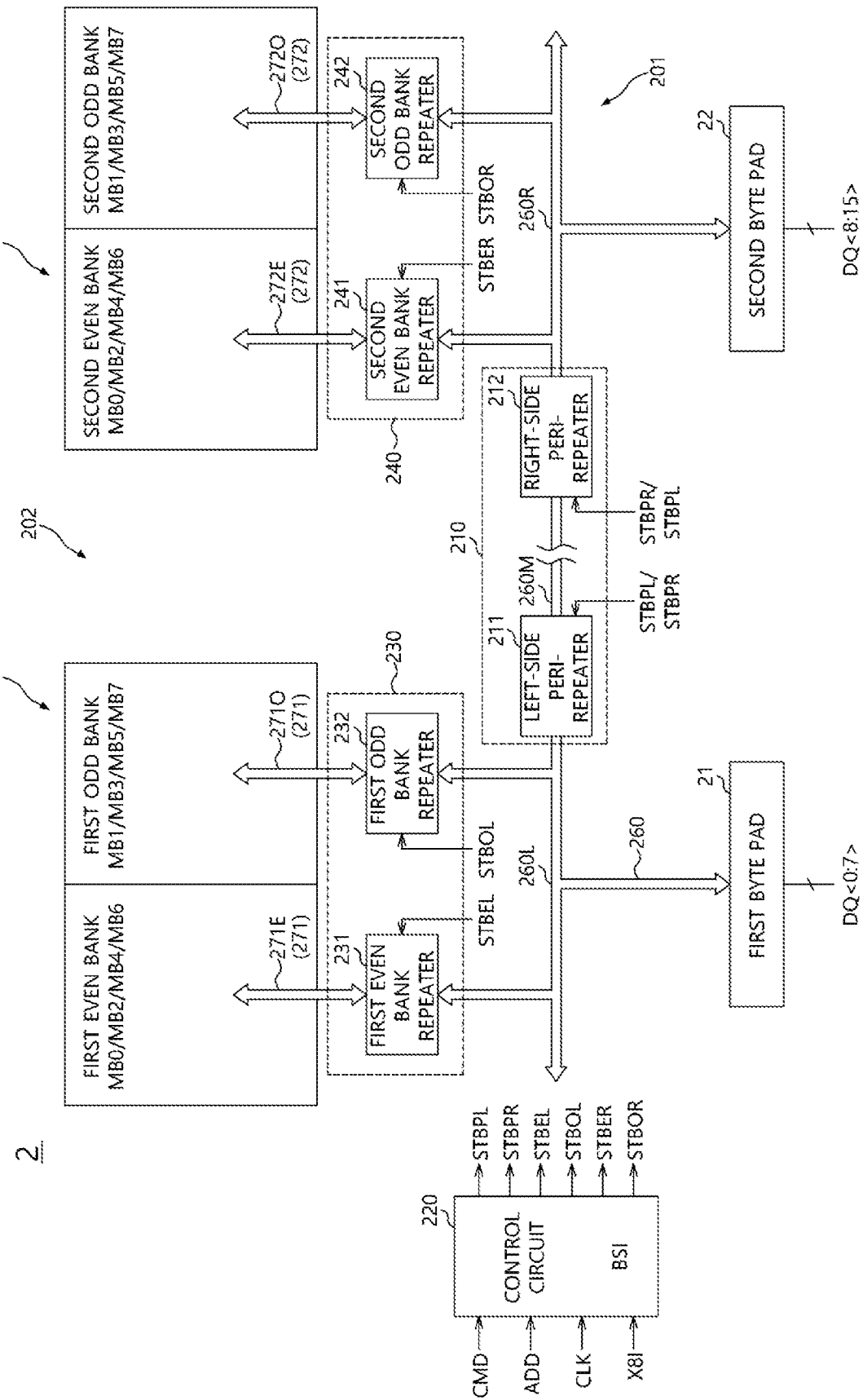
FIG. 2 is a diagram illustrating a representation of an example configuration of a semiconductor memory apparatus in accordance with an embodiment.

FIG. 2 is a diagram illustrating a representation of an example configuration of a semiconductor memory apparatus 2 in accordance with an embodiment. The semiconductor memory apparatus 2 may be applicable to the second semiconductor apparatus 120 described with reference to FIG. 1. The semiconductor memory apparatus 2 may be classified into a peri-region 201 and a memory bank region 202. The memory bank region 202 may be a core region where a plurality of memory banks are provided. In the memory bank region 202, core circuits may be provided to store data into the plurality of memory banks and output data stored in the plurality of memory banks. In the peri-region 201, overall control circuits related to operation of the semiconductor memory apparatus 2 may be provided except for the circuits provided in the memory bank region 202. The semiconductor memory apparatus 2 may include a peri-line 260 provided in the peri-region 201 for transmission of data. The semiconductor memory apparatus 2 may also include bank lines 271 and 272 provided in the memory bank region 202 for transmitting data.

The semiconductor memory apparatus 2 may include a first memory bank region 202A and a second memory bank region 202B. For example, the first memory bank region 202A may be a left-side or an upper-side memory bank region and the second memory bank region 202B may be a right-side or a lower-side memory bank region. Each of the first memory bank region 202A and the second memory bank region 202B may include a plurality of memory banks. The first memory bank region 202A may include a first even bank and a first odd bank. Each of the first even bank and the first odd bank may include one or more memory banks. For example, the first even bank may include a zero-th memory bank MB0, a second memory bank MB2, a fourth memory bank MB4, and a sixth memory bank MB6. Further, the first odd bank may include a first memory bank MB1, a third memory bank MB3, a fifth memory bank MB5, and a seventh memory bank MB7. The second memory bank region 202B may include a second even bank and a second odd bank. Each of the second even bank and the second odd bank may include one or more memory banks. For example, the second even bank may include a zero-th memory bank MB0, a second memory bank MB2, a fourth memory bank MB4, and a sixth memory bank MB6. Further, the second odd bank may include a first memory bank MB1, a third memory bank MB3, a fifth memory bank MB5, and a seventh memory bank MB7. FIG. 2 exemplifies the first memory bank region 202A and the second memory bank region 202B each including eight memory banks, and exemplifies an even bank and an odd bank each including four memory banks. However, the number of memory banks included in each of the first memory bank region 202A and the second memory bank region 202B will not be limited to this particular number. The second memory bank region 202B may have a structure of memory banks symmetrical to that of the first memory bank region 202A.

The semiconductor memory apparatus 2 may include a first byte pad 21 and a second byte pad 22. The first byte pad 21 may be electrically coupled to a first data bus DQ<0:7>, and the second byte pad 22 may be electrically coupled to a second data bus DQ<8:15>. The first byte pad 21 and the second byte pad 22 may receive data provided through the first data bus DQ<0:7> and the second data bus DQ<8:15>, and may transfer data from the semiconductor memory apparatus 2 to the first data bus DQ<0:7> and the second data bus DQ<8:15>, respectively. One or both of the first byte pad 21 and the second byte pad 22 may be activated according to the byte operation mode. In the first byte operation mode, one of the first byte pad 21 and the second byte pad 22 may be selectively activated. In the second byte operation mode, all of the first byte pad 21 and the second byte pad 22 may be activated. The semiconductor memory apparatus 2 may receive and output data through the first byte pad 21 and the second byte pad 22 is activated according to the byte operation mode. In the first byte operation mode, the semiconductor memory apparatus 2 may receive and output data through the selectively activated one among the first byte pad 21 and the second byte pad 22. In the second byte operation mode, the semiconductor memory apparatus 2 may receive and output data through both the first byte pad 21 and the second byte pad 22.

The first byte pad 21 and the second byte pad 22 may be electrically coupled to the first memory bank region 202A and the second memory bank region 202B through the peri-line 260. The peri-line 260 may include a left-side peri-line 260L and a right-side peri-line 260R. The left-side peri-line 260L may be a left-side part of the peri-line 260 and the right-side peri-line 260R may be a right-side part of the peri-line 260. The left-side peri-line 260L may electrically couple the first byte pad 21 and the first memory bank region 202A. The right-side peri-line 260R may electrically couple the second byte pad 22 and the second memory bank region 202B. The semiconductor memory apparatus 2 may include a peri-repeater 210. The peri-repeater 210 may electrically couple the left-side peri-line 260L and the right-side peri-line 260R in response to peri-strobe signals STBPL and STBPR. For example, the peri-repeater 210 may electrically couple the left-side peri-line 260L and the right-side peri-line 260R when the peri-strobe signals STBPL and STBPR are enabled. On the other hand, the peri-repeater 210 may electrically de-couple the left-side peri-line 260L and the right-side peri-line 260R when the peri-strobe signals STBPL and STBPR are disabled.

Referring to FIG. 2, the peri-repeater 210 may include a left-side peri-repeater 211 and a right-side peri-repeater 212. The peri-strobe signals STBPL and STBPR may include a first peri-strobe signal STBPL and a second peri-strobe signal STBPR. The left-side peri-repeater 211 may electrically couple the left-side peri-line 260L and a middle peri-line 260M in response to the first peri-strobe signal STBPL and the second peri-strobe signal STBPR. The right-side peri-repeater 212 may electrically couple the middle peri-line 260M and the right-side peri-line 260R in response to the first peri-strobe signal STBPL and the second peri-strobe signal STBPR. When the first peri-strobe signal STBPL is enabled, the left-side peri-repeater 211 may drive the middle peri-line 260M according to data provided through the left-side peri-line 260L and the right-side peri-repeater 212 may drive the right-side peri-line 260R according to data provided through the middle peri-line 260M. When the second peri-strobe signal STBPR enabled, the right-side peri-repeater 212 may drive the middle peri-line 260M according to data provided through the right-side peri-line 260R and the left-side peri-repeater 211 may drive the left-side peri-line 260L according to data provided through the middle peri-line 260M.

The semiconductor memory apparatus 2 may further include a control circuit 220. The control circuit 220 may generate the peri-strobe signals STBPL and STBPR according to the byte information X8I and memory bank selection information BSI. The control circuit 220 may generate the first peri-strobe signal STBPL and the second peri-strobe signal STBPR according to the byte information X8I and the memory bank selection information BSI. The byte information X8I may include information about the byte operation mode of the semiconductor memory apparatus 2 and information about the first byte pad 21 and second byte pad 22, which are activated and/or selected. The memory bank selection information BSI may include information about a memory bank substantially performing a data input/output operation. The memory bank selection information BSI may be generated based on a command signal CMD and an address signal ADD. The first peri-strobe signal STBPL and the second peri-strobe signal STBPR may be generated based on a clock signal CLK. For example, the clock signal CLK may be generated based on a data strobe signal. The control circuit 220 may generate the first peri-strobe signal STBPL and the second peri-strobe signal STBPR based on a received command signal CMD, address signal ADD, byte information X8I, and clock signal CLK.

Referring to FIG. 2, the semiconductor memory apparatus 2 may include a first bank line 271, a first bank repeater 230, a second bank line 272, and a second bank repeater 240. The first bank line 271 may be arranged in the first memory bank region 202A. The first bank repeater 230 may electrically couple the left-side peri-line 260L and the first bank line 271, and the first bank repeater 230 may also uncouple the right-side peri-line 260R and the second bank line 272. The first bank repeater 230 may electrically couple the left-side peri-line 260L and the first bank line 271 in response to first bank strobe signals STBEL and STBOL. The second bank line 272 may be arranged in the second memory bank region 202B. The second bank repeater 240 may electrically couple the right-side peri-line 260R and the second bank line 272, and the first bank repeater 230 may also uncouple the left-side peri-line 260L and the first bank line 271. The second bank repeater 240 may electrically couple the right-side peri-line 260R and the second bank line 272 in response to second bank strobe signals STBER and STBOR.

Referring to FIG. 2, the first bank line 271 may include a first even bank line 271E and a first odd bank line 271O. The first bank repeater 230 may include a first even bank repeater 231 and a first odd bank repeater 232. The first bank strobe signals STBEL and STBOL may include a first even bank strobe signal STBEL and a first odd bank strobe signal STBOL. The first even bank line 271E may be electrically coupled to the memory banks MB0, MB2, MB4, and MB6 included in the first even bank. The first even bank repeater 231 may electrically couple the left-side peri-line 260L and the first even bank line 271E. The first even bank repeater 231 may electrically couple the left-side peri-line 260L and the first even bank line 271E in response to the first even bank strobe signal STBEL. The first odd bank line 271O may be electrically coupled to the memory banks MB1, MB3, MBS, and MB7 included in the first odd bank. The first odd bank repeater 232 may electrically couple the left-side peri-line 260L and the first odd bank line 271O. The first odd bank repeater 232 may electrically couple the left-side peri-line 260L and the first odd bank line 271O in response to the first odd bank strobe signal STBOL.

The second bank line 272 may include a second even bank line 272E and a second odd bank line 272O. The second bank repeater 240 may include a second even bank repeater 241 and a second odd bank repeater 242. The second bank strobe signals STBER and STBOR may include a second even bank strobe signal STBER and a second odd bank strobe signal STBOR. The second even bank line 272E may be electrically coupled to the memory banks MB0, MB2, MB4, and MB6 included in the second even bank. The second even bank repeater 241 may electrically couple the right-side peri-line 260R and the second even bank line 272E. The second even bank repeater 241 may electrically couple the right-side peri-line 260R and the second even bank line 272E in response to the second even bank strobe signal STBER. The second odd bank line 272O may be electrically coupled to the memory banks MB1, MB3, MBS, and MB7 included in the second odd bank. The second odd bank repeater 242 may electrically couple the right-side peri-line 260R and the second odd bank line 272O. The second odd bank repeater 242 may electrically couple the right-side peri-line 260R and the second odd bank line 272O in response to the second odd bank strobe signal STBOR.

The control circuit 220 may further generate the first bank strobe signals STBEL and STBOL and the second bank strobe signals STBER and STBOR based on the byte information X8I and the memory bank selection information BSI. The control circuit 220 may generate the first even bank strobe signal STBEL, the first odd bank strobe signal STBOL, the second even bank strobe signal STBER, and the second odd bank strobe signal STBOR based on the byte information X8I and the memory bank selection information BSI. The first even bank strobe signal STBEL, the first odd bank strobe signal STBOL, the second even bank strobe signal STBER, and the second odd bank strobe signal STBOR may be generated based on the clock signal CLK. For example, the clock signal CLK may be generated based on a data strobe signal. The control circuit 220 may generate the first even bank strobe signal STBEL, the first odd bank strobe signal STBOL, the second even bank strobe signal STBER, and the second odd bank strobe signal STBOR based on a received command signal CMD, address signal ADD, byte information X8I, and clock signal CLK.

The semiconductor memory apparatus 2 may perform an operation in the first byte operation mode as follows. When the first byte pad 21 is activated and the first memory bank region 202A is selected, the control circuit 220 may disable the peri-strobe signals STBPL and STBPR. In detail, the control circuit 220 may disable both of the first peri-strobe signal STBPL and the second peri-strobe signal STBPR. When the first byte pad 21 is activated and the second memory bank region 202B is selected, the control circuit 220 may enable the peri-strobe signal STBPL. In detail, the control circuit 220 may enable the first peri-strobe signal STBPL and may disable the second peri-strobe signal STBPR.

When the second byte pad 22 is activated and the first memory bank region 202A is selected, the control circuit 220 may enable the peri-strobe signal. In detail, the control circuit 220 may enable the second peri-strobe signal STBPR and may disable the first peri-strobe signal STBPL. When the second byte pad 22 is activated and the second memory bank region 202B is selected, the control circuit 220 may enable the peri-strobe signal STBPR. In detail, the control circuit 220 may disable both the first peri-strobe signal STBPL and the second peri-strobe signal STBPR.

When the first memory bank region 202A is selected, the control circuit 220 may enable the first bank strobe signals STBEL and STBOL and may disable the second bank strobe signals STBER and STBOR. When the second memory bank region 202B is selected, the control circuit 220 may disable the first bank strobe signals STBEL and STBOL and may enable the second bank strobe signals STBER and STBOR. In detail, when the first even bank is selected, the control circuit 220 may enable the first even bank strobe signal
STBEL and may disable the first odd bank strobe signal STBOL, the second even bank strobe signal STBER and the second odd bank strobe signal STBOR. When the first odd bank is selected, the control circuit 220 may enable the first odd bank strobe signal STBOL and may disable the first even bank strobe signal STBEL, the second even bank strobe signal STBER, and the second odd bank strobe signal STBOR. When the second even bank is selected, the control circuit 220 may enable the second even bank strobe signal STBER and may disable the second odd bank strobe signal STBOR, the first even bank strobe signal STBEL, and the first odd bank strobe signal STBOL.

When the second odd bank is selected, the control circuit 220 may enable the second odd bank strobe signal STBOR and may disable the second even bank strobe signal STBER, the first even bank strobe signal STBEL and the first odd bank strobe signal STBOL.

Figure 3:
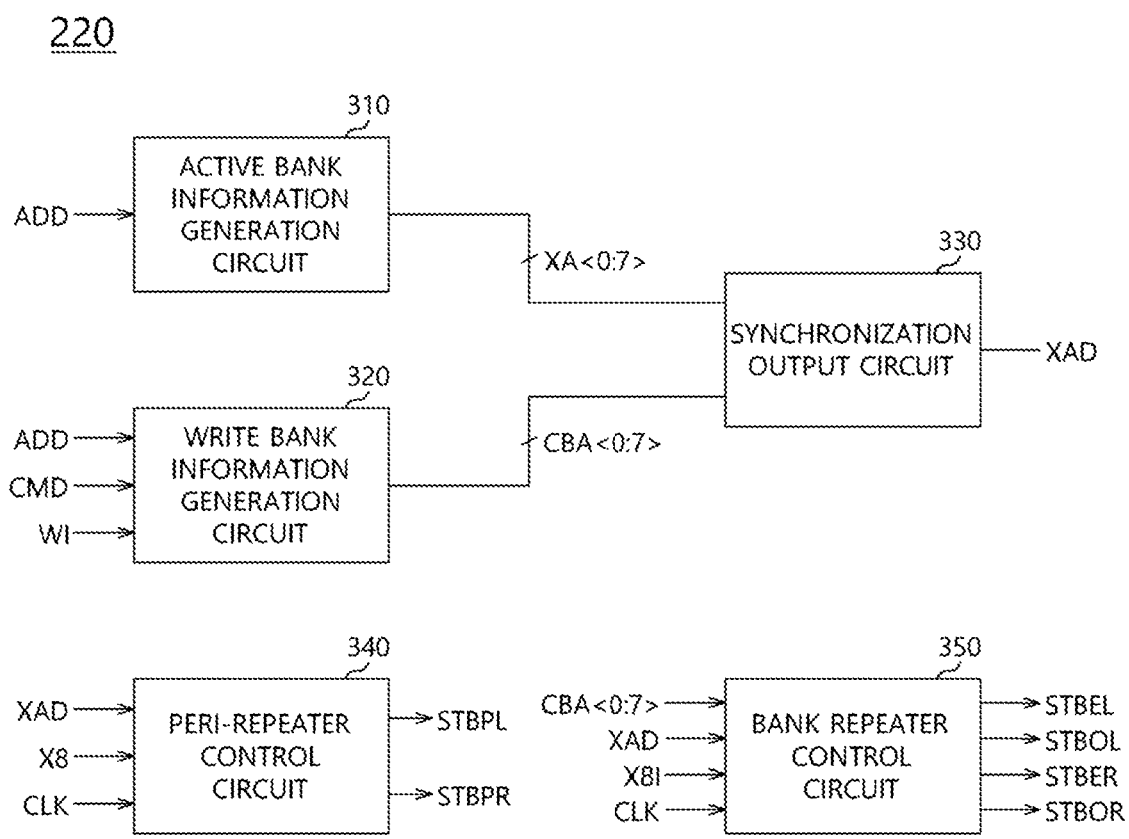
FIG. 3 is a diagram illustrating a representation of an example configuration of a control circuit shown in FIG. 2.

FIG. 3 is a diagram illustrating a representation of an example configuration of the control circuit 220 shown in FIG. 2. Referring to FIG. 3, the control circuit 220 may include an active bank information generation circuit 310, a write bank information generation circuit 320, a synchronization output circuit 330, a per-repeater control circuit 340, and a bank repeater control circuit 350. The active bank information generation circuit 310 may receive the address signal ADD and may generate an active bank selection signal XA<0:7>. FIG. 2 exemplifies the semiconductor memory apparatus 2 including eight memory banks and therefore exemplifies the active bank selection signal XA<0:7> as a 7-bit signal. The active bank selection signal XA<0:7> may include information about an active memory bank during an active operation of the semiconductor memory apparatus 2.

The write bank information generation circuit 320 may receive the command signal CMD and the address signal ADD and may generate a write bank selection signal CBA<0:7>. The write bank selection signal CBA<0:7> may have bits, a number of which corresponds to a number of memory banks. The command signal CMD may be a write command signal related to a write operation of the semiconductor memory apparatus 2. During the write operation of the semiconductor memory apparatus 2, the write bank information generation circuit 320 may include information about a memory bank performing the write operation. The write bank information generation circuit 320 may control a timing of outputting the write bank selection signal CBA<0:7> based on a write information WI. The write information WI may include timing information such as a write latency, a data arrangement time, and so forth. The synchronization output circuit 330 may output the active bank selection signal XA<0:7> as a synchronization bank selection signal XAD based on the write bank selection signal CBA<0:7>. The synchronization output circuit 330 may output the active bank selection signal XA<0:7> as the synchronization bank selection signal XAD at a time when the write bank selection signal CBA<0:7> is generated.

The peri-repeater control circuit 340 may generate the peri-strobe signals STBPL and STBPR in response to the synchronization bank selection signal XAD, the byte operation mode signal X8, and the clock signal CLK. The peri-repeater control circuit 340 may generate the first peri-strobe signal STBPL and the second peri-strobe signal STBPR in response to the synchronization bank selection signal XAD, the byte operation mode signal X8, and the clock signal CLK. The byte operation mode signal X8 may be one of the byte information X8I. The byte operation mode signal X8 may be enabled to a high level in the first byte operation mode, and may be disabled to a low level in the second byte operation mode.

The bank repeater control circuit 350 may generate the first bank strobe signals STBEL and STBOL and the second bank strobe signals STBER and STBOR in response to the write bank selection signal CBA<0:7>, the synchronization bank selection signal XAD, the byte information X8I, and the clock signal CLK. The bank repeater control circuit 350 may generate the first even bank strobe signal STBEL, the first odd bank strobe signal STBOL, the second even bank strobe signal STBER, and the second odd bank strobe signal STBOR in response to the write bank selection signal CBA<0:7>, the synchronization bank selection signal XAD, the byte information X8I, and the clock signal CLK.

Figure 4:
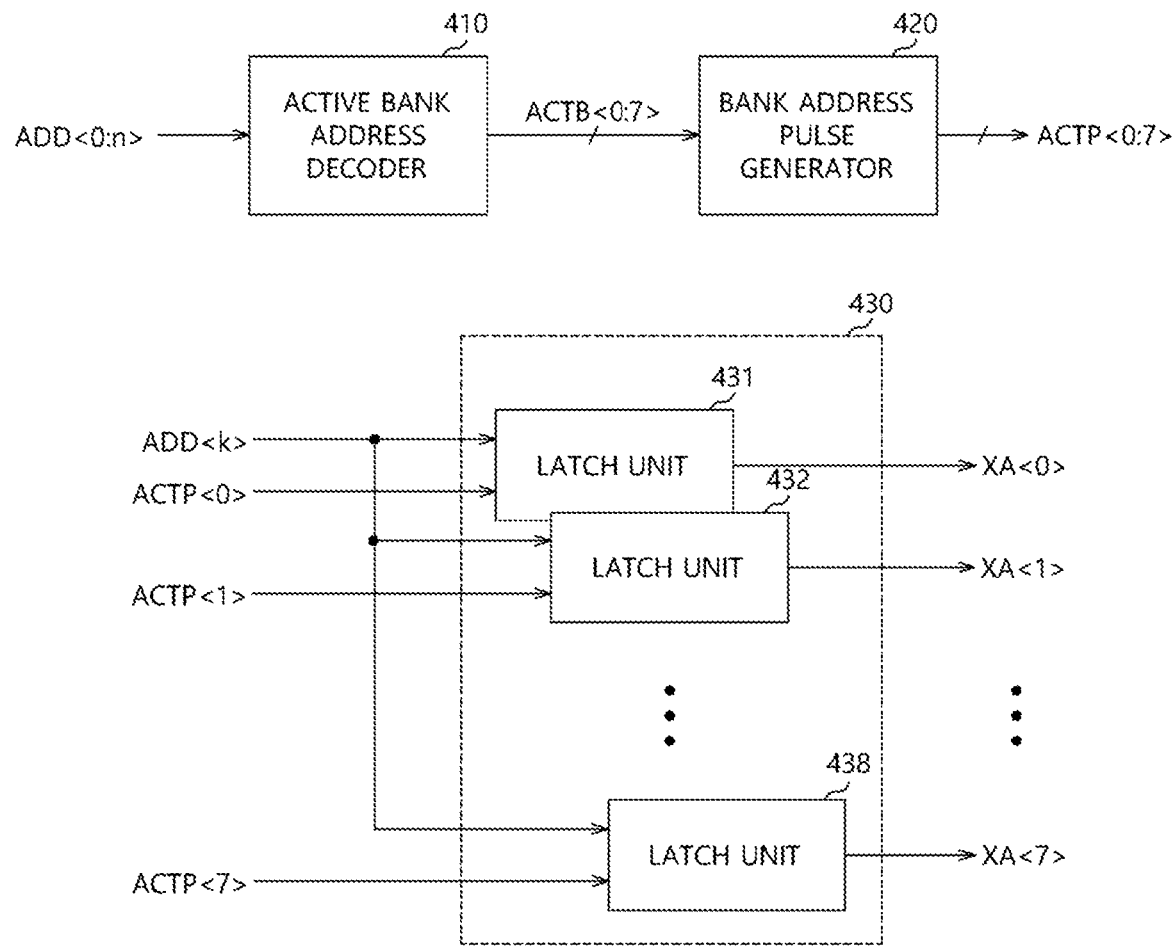
FIG. 4 is a diagram illustrating a representation of an example configuration of an active bank information generation circuit shown in FIG. 3.

FIG. 4 is a diagram illustrating a representation of an example configuration of the active bank information generation circuit 310 shown in FIG. 3. Referring to FIG. 4, the active bank information generation circuit 310 may include an active bank address decoder 410, a bank address pulse generator 420, and an active bank register 430. The active bank address decoder 410 may generate an active bank address signal ACTB<0:7> based on the address signal ADD. Referring to FIG. 2, the first memory bank region 202A and the second memory bank region 202B may be selected according to the same address signal. A particular address signal may be used to select one among the first memory bank region 202A and the second memory bank region 202B. For example, a k-th address signal ADD<k> (k an integer greater than or equal to 1) may be used to select one among the first memory bank region 202A and the second memory bank region 202B. Remaining address signal ADD<0:n> (n an integer greater than or equal to k) except for the k-th address signal ADD<k> which may be used to select a particular memory bank in the first memory bank region 202A and the second memory bank region 202B (e.g., a particular one among the memory banks MB0 to MB7 in the first memory bank region 202A and the memory banks MB0 to MB7 in the second memory bank region 202B). For example, the k-th address signal ADD<k> may have a logic low level to select the first memory bank region 202A and may have a logic high level to select the second memory bank region 202B. The active bank address decoder 410 may generate the active bank address signal ACTB<0:7> based on the remaining address signal ADD<0:n> except for the k-th address signal ADD<k>. The bank address pulse generator 420 may generate an active bank address pulse ACTP<0:7> based on the active bank address signal ACTB<0:7>. The bank address pulse generator 420 may include a pulse generator that generates the active bank address pulse ACTP<0:7> based on the active bank address signal ACTB<0:7>.

The active bank register 430 may generate the active bank selection signal XA<0:7> from the active bank address pulse ACTP<0:7> based on the k-th address signal ADD<k>. The active bank register 430 may include a plurality of latch units 431 to 438. The number of the latch units 431 to 438 may correspond to the number of the active bank address pulse ACTP<0:7>. The plurality of latch units 431 to 438 may receive the assigned active bank address pulse ACTP<0:7>, and may generate and store the active bank selection signal XA<0:7> based on the k-th address signal ADD<k> related to the assigned active bank address pulse ACTP<0:7>, respectively. For example, the plurality of latch units 431 to 438 may generate and store the active bank selection signal XA<0:7> of a low level when the k-th address signal ADD<k> related to the assigned active bank address pulse ACTP<0:7> a low level, and may generate and store the active bank selection signal XA<0:7> of a high level when the k-th address signal ADD<k> related to the assigned active bank address pulse ACTP<0:7> a high level. Therefore, the active bank selection signal XA<0:7> may include information indicating a memory bank region, to which an active memory bank belongs among the first memory bank region 202A and second memory bank region 202B.

Figure 5:
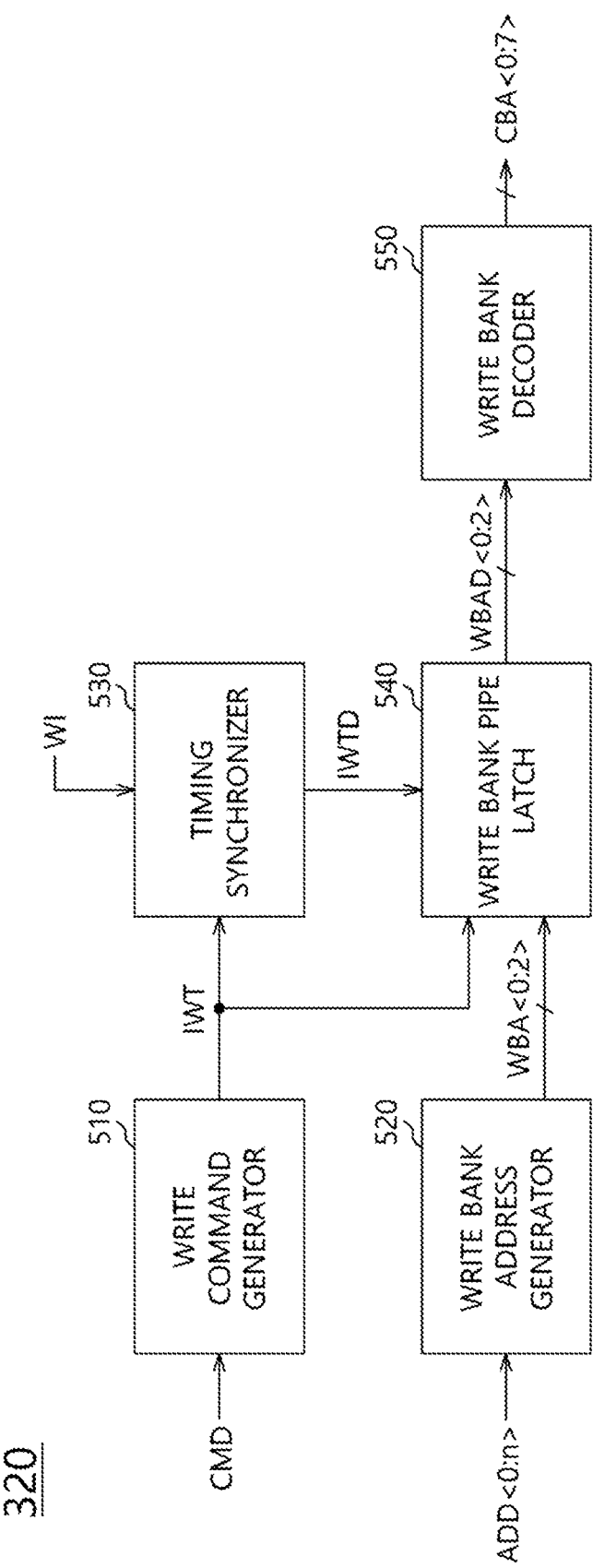
FIG. 5 is a diagram illustrating a representation of an example configuration of a write bank information generation circuit shown in FIG. 3.

FIG. 5 is a diagram illustrating a representation of an example configuration of the write bank information generation circuit 320 shown in FIG. 3. Referring to FIG. 5, the write bank information generation circuit 320 may include a write command generator 510, a write bank address generator 520, a timing synchronizer 530, a write bank pipe latch 540, and a write bank decoder 550. The write command generator 510 may generate an internal write command IWT based on the command signal CMD. The write command generator 510 may be implemented by a general command decoder. The write bank address generator 520 may generate a write bank address signal WBA<0:2> based on the address signal ADD<0:n>. The address signal ADD<0:n> may be provided with the command signal CMD for a write operation and for selecting a memory bank to perform a write operation. For example, the write bank address signal WBA<0:2> may include 3 bits when eight memory banks are included in each of the first memory bank region 202A and the second memory bank region 202B. The write bank address signal WBA<0:2> may include information about a memory bank that stores data as a result of a substantially performed write operation. The timing synchronizer 530 may receive the internal write command IWT and may generate a delayed write signal IWTD based on the write information WI. The timing synchronizer 530 may generate the delayed write signal IWTD by delaying the internal write command IWT by an amount of time corresponding to the write information WI. The write bank pipe latch 540 may receive the write bank address signal WBA<0:2>, the internal write command IWT, and the delayed write signal IWTD. The write bank pipe latch 540 may receive and store the write bank address signal WBA<0:2> in synchronization with the internal write command IWT. The write bank pipe latch 540 may output the stored write bank address signal WBA<0:2> as a delayed write bank address signal WBAD<0:2> in synchronization with the delayed write signal IWTD. The write bank decoder 550 may generate the write bank selection signal CBA<0:7> by decoding the delayed write bank address signal WBAD<0:2>.

FIG. 6 is a diagram illustrating a representation of an example configuration of the synchronization output circuit 330 shown in FIG. 3. Referring to FIG. 6, the synchronization output circuit 330 may be implemented using a multiplexer 610. The synchronization output circuit 330 may receive the write bank selection signal CBA<0:7> and the active bank selection signal XA<0:7> and may output the synchronization bank selection signal XAD. The synchronization output circuit 330 may adjust a generation time of the peri-strobe signals STBPL and STBPR and the first bank strobe signals STBEL and STBOL and the second bank strobe signals STBER and STBOR by outputting the active bank selection signal XA<0:7> as the synchronization bank selection signal XAD based on the write bank selection signal CBA<0:7>. Therefore, the peri-strobe signals STBPL and STBPR and the first bank strobe signals STBEL and STBOL and the second bank strobe signals STBER and STBOR may be generated in a timely manner when the semiconductor memory apparatus 2 substantially performs a write operation.

FIG. 7 is a diagram illustrating a representation of an example configuration of the peri-repeater control circuit 340 shown in FIG. 3. Referring to FIG. 7, the peri-repeater control circuit 340 may include a first NAND gate ND11, a first NOR gate NR11, an inverter IV, a second NAND gate ND12, and a second NOR gate NR12.

The first NAND gate ND11 may receive the synchronization bank selection signal XAD, a first byte pad selection signal X8_1, and a second byte pad selection signal X8_2. The first byte pad selection signal X8_1 and the second byte pad selection signal X8_2 may be a part of the byte information X8I. When the semiconductor memory apparatus 2 operates in the first byte operation mode, the first byte pad selection signal X8_1 may be enabled to a high level when the first byte pad 21 is activated and the second byte pad selection signal X8_2 may be enabled to a high level when the second byte pad 22 activated. The first NAND gate ND11 may receive the synchronization bank selection signal XAD and the first byte pad selection signal X8_1. The first NOR gate NR11 may generate the first peri-strobe signal STBPL based on received output from the first NAND gate ND11 and a complementary signal CLKB of the clock signal CLK. When the first byte pad selection signal X8_1 enabled, the peri-repeater control circuit 340 may disable the second peri-strobe signal STBPR when the synchronization bank selection signal XAD is a low level and may enable the first byte pad selection signal X8_1 when the synchronization bank selection signal XAD is a high level. That is, the peri-repeater control circuit 340 may provide the clock signal CLK as the first peri-strobe signal STBPL. The inverter IV may invert the synchronization bank selection signal XAD and output the inverted synchronization bank selection signal XAD. The second NAND gate ND12 may receive output from the inverter IV and the second byte pad selection signal X8_2. The second NOR gate NR12 may generate the second peri-strobe signal STBPR based on received output from the second NAND gate ND12 and the complementary signal CLKB of the clock signal CLK. When the second byte pad selection signal X8_2 enabled, the peri-repeater control circuit 340 may enable the second peri-strobe signal STBPR when the synchronization bank selection signal XAD is a low level and may disable the second peri-strobe signal STBPR when the synchronization bank selection signal XAD is a high level. The peri-repeater control circuit 340 may disable the second peri-strobe signal STBPR when the first byte pad 21 is activated and the first byte pad selection signal X8_1 enabled. At this time, the peri-repeater control circuit 340 may disabled the first peri-strobe signal STBPL when the first memory bank region 202A is selected and may enable the first peri-strobe signal STBPL when the second memory bank region 202B is selected. The peri-repeater control circuit 340 may disable the first peri-strobe signal STBPL when the second byte pad 22 is activated and the second byte pad selection signal X8_2 enabled. At this time, the peri-repeater control circuit 340 may enable the second peri-strobe signal STBPR when the first memory bank region 202A is selected and may disable the second peri-strobe signal STBPR when the second memory bank region 202B is selected.

All of the first byte pad selection signal X8_1 and the second byte pad selection signal X8_2 may be enabled to a low level when the semiconductor memory apparatus 2 operates in the second byte operation mode. Therefore, the peri-repeater control circuit 340 may disable the first peri-strobe signal STBPL and the second peri-strobe signal STBPR regardless of the synchronization bank selection signal XAD.

Figure 8:
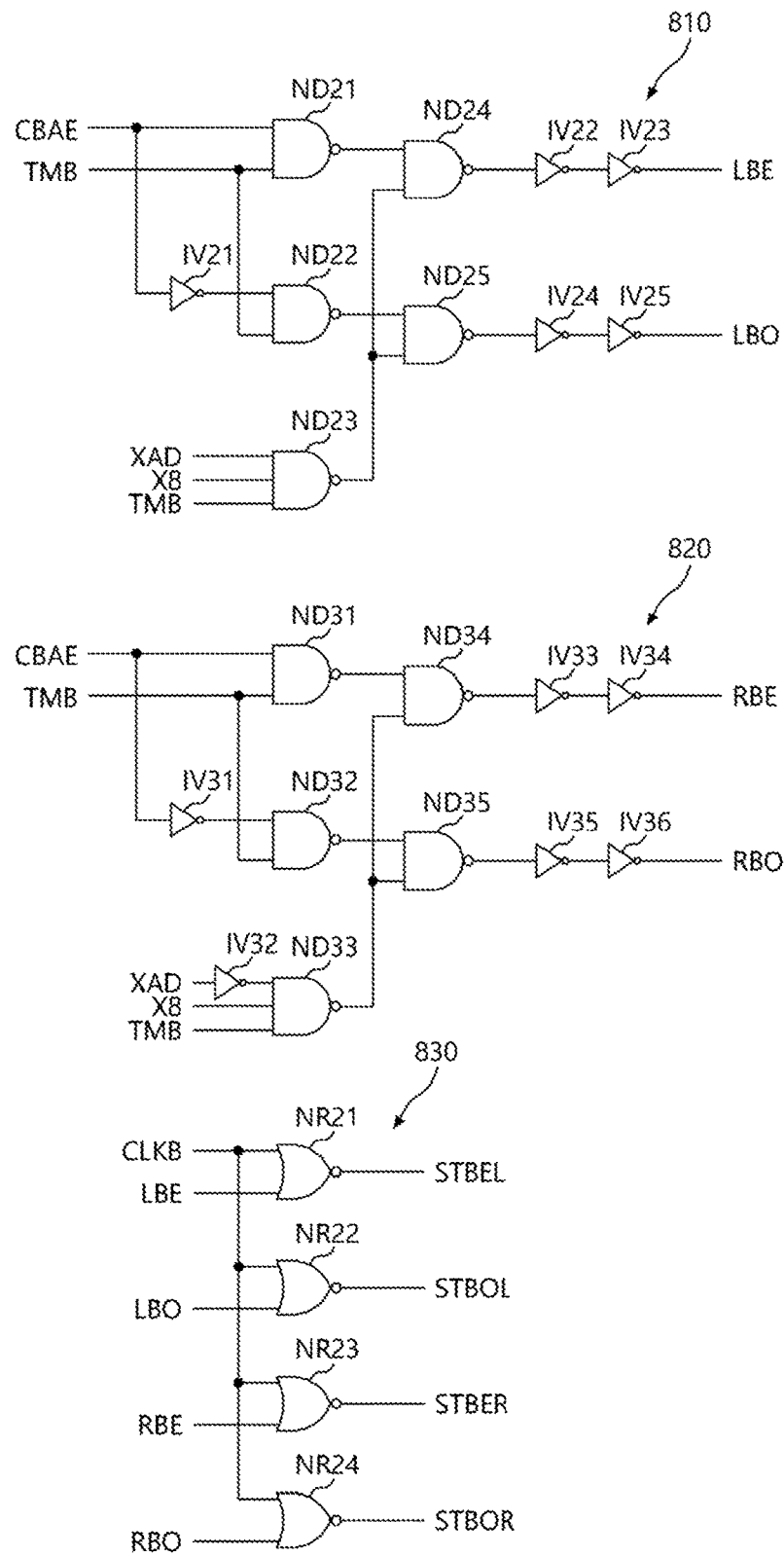
FIG. 8 is a diagram illustrating a representation of an example configuration of a bank repeater control circuit shown in FIG. 3.

FIG. 8 is a diagram illustrating a representation of an example configuration of the bank repeater control circuit 350 shown in FIG. 3. Referring to FIG. 8, the bank repeater control circuit 350 may include a first bank selection signal generator 810, a second bank selection signal generator 820, and a bank strobe generator 830. The first bank selection signal generator 810 may generate a first even bank selection signal LBE and a first odd bank selection signal LBO based on an even/odd bank signal CBAE, the synchronization bank selection signal XAD, and the byte operation mode signal X8. The even/odd bank signal CBAE may be generated based on the write bank selection signal CBA<0:7>. For example, when the write bank selection signal CBA<0:7> related to one among the zero-th memory bank MB0, the second memory bank MB2, the fourth memory bank MB4, and the sixth memory bank MB6 included in the first even bank and the second even bank, the even/odd bank signal CBAE may be a low level. For example, when the write bank selection signal CBA<0:7> related to one among the first memory bank MB1, the third memory bank MB3, the fifth memory bank MB5, and the seventh memory bank MB7 included in the first odd bank and the second odd bank, the even/odd bank signal CBAE may be a high level. The second bank selection signal generator 820 may generate a second even bank selection signal RBE and a second odd bank selection signal RBO based on the even/odd bank signal CBAE, the synchronization bank selection signal XAD, and the byte operation mode signal X8. The bank strobe generator 830 may generate the first even bank strobe signal STBEL, the first odd bank strobe signal STBOL, the second even bank strobe signal STBER, and the second odd bank strobe signal STBOR based on the first even bank selection signal LBE, the first odd bank selection signal LBO, the second even bank selection signal RBE, the second odd bank selection signal RBO, and the complementary signal CLKB of the clock signal CLK.

The first bank selection signal generator 810 may include a first NAND gate ND21, a first inverter IV21, a second NAND gate ND22, a third NAND gate ND23, a fourth NAND gate ND24, a second inverter IV22, a third inverter IV23, a fifth NAND gate ND25, a fourth inverter IV24, and a fifth inverter IV25. The first NAND gate ND21 may receive the even/odd bank signal CBAE and a reset signal TMB. The reset signal TMB may be input for resetting the semiconductor memory apparatus 2, and may be of a high level during an operation other than a reset operation. The first inverter IV21 may invert the even/odd bank signal CBAE. The second NAND gate ND22 may receive output from the first inverter IV21 and the reset signal TMB. The third NAND gate ND23 may receive the synchronization bank selection signal XAD, the byte operation mode signal X8, and the reset signal TMB. The fourth NAND gate ND24 may receive outputs from the first NAND gate ND21 and the third NAND gate ND23. The second inverter IV22 and the third inverter IV23 may output the first even bank selection signal LBE by buffering output of the fourth NAND gate ND24. The fifth NAND gate ND25 may receive the outputs of the second NAND gate ND22 and the third NAND gate ND23. The fourth inverter IV24 and the fifth inverter IV25 may output the first odd bank selection signal LBO by buffering output of the fifth NAND gate ND25.

The second bank selection signal generator 820 may include a first NAND gate ND31, a first inverter IV31, a second NAND gate ND32, a second inverter IV32, a third NAND gate ND33, a fourth NAND gate ND34, a third inverter IV33, a fourth inverter IV34, a fifth NAND gate ND35, a fifth inverter IV35, and a sixth inverter IV36. The first NAND gate ND31 may receive the even/odd bank signal CBAE and the reset signal TMB. The first inverter IV31 may invert the even/odd bank signal CBAE. The second NAND gate ND32 may receive output from the first inverter IV31 and the reset signal TMB. The second inverter IV32 may invert the synchronization bank selection signal XAD. The third NAND gate ND33 may receive output from the second inverter IV32, the byte operation mode signal X8, and the reset signal TMB. The fourth NAND gate ND34 may receive outputs from the first NAND gate ND31 and the third NAND gate ND33. The third inverter IV33 and the fourth inverter IV34 may output the second even bank selection signal RBE by buffering output of the fourth NAND gate ND34. The fifth NAND gate ND35 may receive the outputs of the second NAND gate ND32 and the third NAND gate ND33. The fifth inverter IV35 and the sixth inverter IV36 may output the second odd bank selection signal RBO by buffering output of the fifth NAND gate ND35.

The bank strobe generator 830 may include first to fourth NOR gates NR21, NR22, NR23, and NR24. The first NOR gate NR21 may generate the first even bank strobe signal STBEL based on a received complementary signal CLKB of the clock signal CLK and the first even bank selection signal LBE. The second NOR gate NR22 may generate the first odd bank strobe signal STBOL based on a received complementary signal CLKB of the clock signal CLK and the first odd bank selection signal LBO. The third NOR gate NR23 may generate the second even bank strobe signal STBER based on a received complementary signal CLKB of the clock signal CLK and the second even bank selection signal RBE. The fourth NOR gate NR24 may generate the second odd bank strobe signal STBOR based on a received complementary signal CLKB of the clock signal CLK and the second odd bank selection signal RBO.

When the semiconductor memory apparatus 2 operates in the first byte operation mode, the byte operation mode signal X8 may be enabled to a high level. At this time, when the even/odd bank signal CBAE may be a low level and the synchronization bank selection signal XAD is a low level, the first even bank selection signal LBE may be enabled to a low level and the first odd bank selection signal LBO, the second even bank selection signal RBE and the second odd bank selection signal RBO may be disabled to a high level. Therefore, the first NOR gate NR21 may enable the first even bank strobe signal STBEL by outputting the complementary signal CLKB of the clock signal CLK as the first even bank strobe signal STBEL. When the even/odd bank signal CBAE is a high level and the synchronization bank selection signal XAD is a low level, the first odd bank selection signal LBO may be enabled to a low level and the first even bank selection signal LBE, the second even bank selection signal RBE, and the second odd bank selection signal RBO may be disabled to a high level. Therefore, the second NOR gate NR22 may enable the first odd bank strobe signal STBOL by outputting the complementary signal CLKB of the clock signal CLK as the first odd bank strobe signal STBOL. When the even/odd bank signal CBAE is a low level and the synchronization bank selection signal XAD is a high level, the second even bank selection signal RBE may be enabled to a low level and the first even bank selection signal LBE, the first odd bank selection signal LBO, and the second odd bank selection signal RBO may be disabled to a high level. Therefore, the third NOR gate NR23 may enable the second even bank strobe signal STBER by outputting the complementary signal CLKB of the clock signal CLK as the second even bank strobe signal STBER. When the even/odd bank signal CBAE is a high level and the synchronization bank selection signal XAD is a high level, the second odd bank selection signal RBO may be enabled to a low level and the first even bank selection signal LBE, the first odd bank selection signal LBO, and the second even bank selection signal RBE may be disabled to a high level. Therefore, the fourth NOR gate NR24 may enable the second odd bank strobe signal STBOR by outputting the complementary signal CLKB of the clock signal CLK as the second odd bank strobe signal STBOR.

When the semiconductor memory apparatus 2 operates in the second byte operation mode, the byte operation mode signal X8 may be disabled to a low level. Therefore, the outputs of the third NAND gates ND23 and ND33 of the first bank selection signal generator 810 and the second bank selection signal generator 820 may be of a high level regardless of the synchronization bank selection signal XAD. Therefore, when the even/odd bank signal CBAE is a low level, the first even bank selection signal LBE and the second even bank selection signal RBE may be enabled to a low level and the first NOR gate NR21 and the third NOR gate NR23 may enable the first even bank strobe signal STBEL and the second even bank strobe signal STBER. When the when the even/odd bank signal CBAE is a high level, the first odd bank selection signal LBO and the second odd bank selection signal RBO may be enabled to a low level and the second NOR gate NR22 and the fourth NOR gate NR24 may enable the first odd bank strobe signal STBOL and the second odd bank strobe signal STBOR.

Referring to FIGS. 2 to 8, operation of the semiconductor memory apparatus 2 in accordance with an embodiment may be as follows. The semiconductor memory apparatus 2 may operate as follows in the first byte operation mode. For example, when the first byte pad 21 is activated and the zero-th memory bank MB0 of the first memory bank region 202A is selected and thus a write operation is performed, data may be received through the first byte pad 21, the received data may be delayed by an amount of time corresponding to the write information WI and the delayed data may be transferred to the left-side peri-line 260L. The active bank information generation circuit 310 may output the active bank selection signal XA<0> of a low level. The synchronization output circuit 330 may output the synchronization bank selection signal XAD of a low level in synchronization with the time when the write bank information generation circuit 320 generates the write bank selection signal CBA<0>. Therefore, the peri-repeater control circuit 340 may disable the first peri-strobe signal STBPL and the second peri-strobe signal STBPR. At the time when a write operation of the first even bank is substantially performed, that is, after time corresponding to the write information WI elapses, the bank repeater control circuit 350 may enable the first even bank strobe signal STBEL while the first odd bank strobe signal STBOL, the second even bank strobe signal STBER, and the second odd bank strobe signal STBOR may be disabled. Therefore, the first even bank repeater 231 may transfer data, which is provided through the left-side peri-line 260L, to the first even bank line 271E based on the first even bank strobe signal STBEL. The data transferred through the first even bank line 271E may be stored in the zero-th memory bank MB0 of the first memory bank region 202A. At this time, because the left-side peri-repeater 211, the right-side peri-repeater 212, the first odd bank repeater 232, the second even bank repeater 241, and the second odd bank repeater 242 are not driven, the first odd bank line 271O, the middle peri-line 260M, the right-side peri-line 260R, the second even bank line 272E, and the second odd bank line 272O might not be toggled or driven. Therefore, power consumption for a write operation of the semiconductor memory apparatus 2 may be minimized. Also, because the first even bank strobe signal STBEL enabled at a time when a write operation is substantially performed, data provided through the left-side peri-line 260L may be transferred to the first even bank line 271E at a precise time.

For example, when the first byte pad 21 is activated and the first memory bank MB1 of the second memory bank region 202B is selected and thus a write operation is performed, data may be received through the first byte pad 21 and the received data should be transferred to the second memory bank region 202B through the right-side peri-line 260R. The peri-repeater control circuit 340 may enable the first peri-strobe signal STBPL and may disable the second peri-strobe signal STBPR. The bank repeater control circuit 350 may enable the second odd bank strobe signal STBOR while the first even bank strobe signal STBEL, the first odd bank strobe signal STBOL, and the second even bank strobe signal STBER may be disabled. The data provided to the left-side peri-line 260L may be transferred to middle peri-line 260M through the left-side peri-repeater 211. The right-side peri-repeater 212 may drive the right-side peri-line 260R based on data provided to the middle peri-line 260M. The second odd bank repeater 242 may drive the second odd bank line 272O based on data transferred through the right-side peri-line 260R. The data transferred to the second odd bank line 272O may be stored in the first memory bank MB1 of the second memory bank region 202B. At this time, the left-side peri-line 260L, the middle peri-line 260M, the right-side peri-line 260R, and the second odd bank line 272O may be toggled and/or driven while the first even bank line 271E, the first odd bank line 271O, and the second even bank line 272E might not be toggled or driven. Therefore, the semiconductor memory apparatus 2 may store data, which received through the first byte pad 21, into the second memory bank region 202B while consuming minimized power.

For example, when the second byte pad 22 is activated and the first memory bank MB1 of the second memory bank region 202B is selected and thus a write operation is performed, data may be received through the second byte pad 22, the received data may be delayed by an amount of time corresponding to the write information WI and the delayed data may be transferred to the right-side peri-line 260R. The active bank information generation circuit 310 may output the active bank selection signal XA<1> of a high level. The synchronization output circuit 330 may output the synchronization bank selection signal XAD of a high level in synchronization with the time when the write bank information generation circuit 320 generates the write bank selection signal CBA<1>. Therefore, the peri-repeater control circuit 340 may disable the first peri-strobe signal STBPL and the second peri-strobe signal STBPR. At the time when a write operation of the second odd bank substantially performed, that is, after time corresponding to the write information WI elapses, the bank repeater control circuit 350 may enable the second odd bank strobe signal STBOR while the first even bank strobe signal STBEL, the first odd bank strobe signal STBOL, and the second odd bank strobe signal STBOR may be disabled. Therefore, the second odd bank repeater 242 may transfer data, which provided through the right-side peri-line 260R, to the second odd bank line 272O based on the second odd bank strobe signal STBOR. The data transferred through the second odd bank line 272O may be stored in the first memory bank MB1 of the second memory bank region 202B. At this time, because the left-side peri-repeater 211, the right-side peri-repeater 212, the first even bank repeater 231, the first odd bank repeater 232, and the second even bank repeater 241 are not driven, the first even bank line 271E, the first odd bank line 271O, the left-side peri-line 260L, the middle peri-line 260M and the second even bank line 272E might not be toggled or driven. Therefore, power consumption for a write operation of the semiconductor memory apparatus 2 may be minimized. Also, because the second odd bank strobe signal STBOR enabled at a time when a write operation substantially performed, data provided through the right-side peri-line 260R may be transferred to the second odd bank line 272O at a precise time point.

For example, when the second byte pad 22 is activated and the zero-th memory bank MB0 of the first memory bank region 202A is selected and thus a write operation is performed, data may be received through the second byte pad 22 and the received data should be transferred to the first memory bank region 202A through the left-side peri-line 260L. The peri-repeater control circuit 340 may enable the second peri-strobe signal STBPR and may disable the first peri-strobe signal STBPL. The bank repeater control circuit 350 may enable the first even bank strobe signal STBEL while the first odd bank strobe signal STBOL, the second even bank strobe signal STBER, and the second odd bank strobe signal STBOR may be disabled. The data provided to the right-side peri-line 260R through the second byte pad 22 may be transferred to middle peri-line 260M through the right-side peri-repeater 212. The left-side peri-repeater 211 may drive the left-side peri-line 260L based on the data provided to the middle peri-line 260M. The first even bank repeater 231 may drive the first even bank line 271E based on the data transferred through the left-side peri-line 260L. The data transferred to the first even bank line 271E may be stored in the zero-th memory bank MB0 of the first memory bank region 202A. At this time, the right-side peri-line 260R, the middle peri-line 260M, the left-side peri-line 260L, and the first even bank line 271E may be toggled and/or driven while the first odd bank line 271O, the second even bank line 272E, and the second odd bank line 272O might not be toggled or driven. Therefore, the semiconductor memory apparatus 2 may store data, which is received through the second byte pad 22, into the first memory bank region 202A while consuming minimized power.

While certain embodiments have been described above, it will be understood to those skilled in the art that the embodiments described are by way of example only. Accordingly, the semiconductor memory apparatus and semiconductor system including the same should not be limited based on the described embodiments. Rather, the semiconductor memory apparatus and semiconductor system including the same described herein should only be limited in light of the claims that follow when taken in conjunction with the above description and accompanying drawings.

What is claimed is:

1. A semiconductor memory apparatus comprising:
   a left-side peri-line configured to couple a first byte pad and a first memory bank region;
   a right-side peri-line configured to couple a second byte pad and a second memory bank region;
   a peri-repeater configured to couple the left-side peri-line and the right-side peri-line based on a peri-strobe signal;
   a first bank repeater configured to couple the left-side peri-line and a first bank line arranged in the first memory bank region based on a first bank strobe signal;
   a second bank repeater configured to couple the right-side peri-line and a second bank line arranged in the second memory bank region based on a second bank strobe signal; and
   a control circuit configured to generate the peri-strobe signal, the first bank strobe signal, and the second bank strobe signal based on byte information and memory bank selection information.

2. The semiconductor memory apparatus of claim 1, wherein the first byte pad is coupled to a first data bus, and wherein the second byte pad is coupled to a second data bus.

3. The semiconductor memory apparatus of claim 2, wherein one among the first byte pad and the second byte pad is activated in a first byte operation mode, and wherein both the first byte pad and the second byte pad are activated in a second byte operation mode.

4. The semiconductor memory apparatus of claim 1, wherein when the first byte pad is activated and the first memory bank region is selected the control circuit is configured to enable the first bank strobe signal and disable the peri-strobe signal and the second bank strobe signal.

5. The semiconductor memory apparatus of claim 1, wherein when the first byte pad is activated and the second memory bank region is selected the control circuit is configured to enable the peri-strobe signal and the second bank strobe signal and disable the first bank strobe signal.

6. The semiconductor memory apparatus of claim 1, wherein when the second byte pad is activated and the first memory bank region is selected the control circuit is configured to enable the peri-strobe signal and the first bank strobe signal and disable the second bank strobe signal.

7. The semiconductor memory apparatus of claim 1, wherein when the second byte pad is activated and the second memory bank region is selected the control circuit is configured to enable the second bank strobe signal and disable the peri-strobe signal and the first bank strobe signal.

8. The semiconductor memory apparatus of claim 1, wherein the peri-repeater includes:
   a left-side peri-repeater configured to couple the left-side peri-line and a middle peri-line based on a first peri-strobe signal and a second peri-strobe signal; and
   a right-side peri-repeater configured to couple the middle peri-line and the right-side peri-line based on the first peri-strobe signal and the second peri-strobe signal.

9. The semiconductor memory apparatus of claim 8, wherein when the first byte pad is activated and the second memory bank region is selected the control circuit is configured to enable the first peri-strobe signal and disable the second peri-strobe signal, and
   wherein the left-side peri-repeater drives the middle peri-line according to a signal transferred through the left-side peri-line based on the first peri-strobe signal, and the right-side peri-repeater drives the right-side peri-line according to a signal transferred through the middle peri-line based on the first peri-strobe signal.

10. The semiconductor memory apparatus of claim 8, wherein when the second byte pad is activated and the first memory bank region is selected the control circuit is configured to enable the second peri-strobe signal and disable the first peri-strobe signal, and
    wherein the right-side peri-repeater drives the middle peri-line according to a signal transferred through the right-side peri-line based on the second peri-strobe signal, and the left-side peri-repeater drives the left-side peri-line according to a signal transferred through the middle peri-line based on the second peri-strobe signal.

11. The semiconductor memory apparatus of claim 1, wherein the first memory bank region includes a first even bank and a first odd bank, and the first bank line includes a first even bank line coupled to the first even bank and a first odd bank line coupled to the first odd bank, and wherein the first bank repeater includes:
a first even bank repeater configured to couple the left-side peri-line and the first even bank line based on a first even bank strobe signal; and
a first odd bank repeater configured to couple the left-side peri-line and the first odd bank line based on a first odd bank strobe signal.

12. The semiconductor memory apparatus of claim 11, wherein the second memory bank region includes a second even bank and a second odd bank, and the second bank line includes a second even bank line coupled to the second even bank and a second odd bank line coupled to the second odd bank, and
wherein the second bank repeater includes:
a second even bank repeater configured to couple the right-side peri-line and the second even bank line based on a second even bank strobe signal; and
a second odd bank repeater configured to couple the right-side peri-line and the second odd bank line based on a second odd bank strobe signal.

13. The semiconductor memory apparatus of claim 12, wherein when the first even bank is selected the control circuit is configured to enable the first even bank strobe signal, and disables the first odd bank strobe signal, the second even bank strobe signal and the second odd bank strobe signal.

14. The semiconductor memory apparatus of claim 12, wherein when the first odd bank is selected the control circuit is configured to enable the first odd bank strobe signal and disable the first even bank strobe signal, the second even bank strobe signal, and the second odd bank strobe signal.

15. The semiconductor memory apparatus of claim 12, wherein when the second even bank is selected the control circuit is configured to enable the second even bank strobe signal and disable the second odd bank strobe signal, the first even bank strobe signal, and the first odd bank strobe signal.

16. The semiconductor memory apparatus of claim 12, wherein when the second odd bank is selected the control circuit is configured to enable the second odd bank strobe signal and disable the second even bank strobe signal, the first even bank strobe signal, and the first odd bank strobe signal.

17. The semiconductor memory apparatus of claim 12, wherein the control circuit includes:
an active bank information generation circuit configured to generate an active bank selection signal based on an address signal;
a write bank information generation circuit configured to generate a write bank selection signal based on the address signal and a command signal;
a synchronization output circuit configured to output the active bank selection signal as a synchronization bank selection signal in response to the write bank selection signal;
a peri-repeater control circuit configured to generate the first peri-strobe signal and the second peri-strobe signal based on the synchronization bank selection signal, the byte information, and a clock signal; and
a bank repeater control circuit configured to generate the first even bank strobe signal, the first odd bank strobe signal, the second even bank strobe signal, and the second odd bank strobe signal based on the write bank selection signal, the synchronization bank selection signal, the byte information, and a clock signal.

18. The semiconductor memory apparatus of claim 17, wherein the write bank information generation circuit is configured to adjust a time when the write bank selection signal is output based on write information.

19. A semiconductor memory apparatus comprising:
a left-side peri-line configured to couple a first byte pad and a first memory bank region;
a right-side peri-line configured to couple a second byte pad and a second memory bank region;
a left-side peri-repeater configured to couple the left-side peri-line and a middle peri-line based on a first peri-strobe signal and a second peri-strobe signal;
a right-side peri-repeater configured to couple the middle peri-line and the right-side peri-line based on the first peri-strobe signal and the second peri-strobe signal; and
a control circuit configured to generate the first and second peri-strobe signals based on byte information and memory bank selection information, and to adjust a time of outputting the first and second peri-strobe signals based on write information.

20. The semiconductor memory apparatus of claim 19, wherein the first byte pad is coupled to a first data bus, and wherein the second byte pad is coupled to a second data bus.

21. The semiconductor memory apparatus of claim 20, wherein one among the first byte pad and the second byte pad is activated in a first byte operation mode, and
wherein both the first byte pad and the second byte pad are activated in a second byte operation mode.

22. The semiconductor memory apparatus of claim 19, further comprising:
a first bank repeater configured to couple the left-side peri-line and a first bank line based on a first bank strobe signal; and
a second bank repeater configured to couple the right-side peri-line and a second bank line based on a second bank strobe signal,
wherein the control circuit is configured to further generate the first and second bank strobe signals based on the byte information, the memory bank selection information, and the write information.

23. The semiconductor memory apparatus of claim 22, wherein the first memory bank region includes a first even bank and a first odd bank, and the first bank line includes a first even bank line coupled to the first even bank and a first odd bank line coupled to the first odd bank, and
herein the first bank repeater includes:
a first even bank repeater configured to couple the left-side peri-line and the first even bank line based on a first even bank strobe signal; and
a first odd bank repeater configured to couple the left-side peri-line and the first odd bank line based on a first odd bank strobe signal.

24. The semiconductor memory apparatus of claim 23, wherein the second memory bank region includes a second even bank and a second odd bank, and the second bank line includes a second even bank line coupled to the second even bank and a second odd bank line coupled to the second odd bank, and
wherein the second bank repeater includes:
a second even bank repeater configured to couple the right-side peri-line and the second even bank line based on a second even bank strobe signal; and
a second odd bank repeater configured to couple the right-side peri-line and the second odd bank line based on a second odd bank strobe signal.

* * * * *